United States Patent
Masuko et al.

(10) Patent No.: US 10,784,165 B2
(45) Date of Patent: Sep. 22, 2020

(54) SEMICONDUCTOR DEVICE AND DICING METHOD

(71) Applicants: Kabushiki Kaisha Toshiba, Minato-ku, Tokyo (JP); Toshiba Electronic Devices & Storage Corporation, Minato-ku, Tokyo (JP)

(72) Inventors: Shingo Masuko, Kanazawa Ishikawa (JP); Kazuo Fujimura, Kanazawa Ishikawa (JP); Yoshiharu Takada, Nonoichi Ishikawa (JP); Ichiro Mizushima, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/918,141

(22) Filed: Mar. 12, 2018

(65) Prior Publication Data
US 2019/0267288 A1 Aug. 29, 2019

(30) Foreign Application Priority Data
Feb. 27, 2018 (JP) .................. 2018-033567

(51) Int. Cl.
*H01L 21/78* (2006.01)
*H01L 21/683* (2006.01)
(Continued)

(52) U.S. Cl.
CPC .......... *H01L 21/78* (2013.01); *H01L 21/3043* (2013.01); *H01L 21/6836* (2013.01); *H01L 24/29* (2013.01); *H01L 24/33* (2013.01); *H01L 2221/68327* (2013.01); *H01L 2224/29016* (2013.01); *H01L 2224/29083* (2013.01); *H01L 2224/29118* (2013.01);
(Continued)

(58) Field of Classification Search
CPC ................. H01L 21/78; H01L 21/6836; H01L 2224/29016; H01L 2224/33505; H01L 2224/3303; H01L 41/338; H01L 2221/68327; H01L 2223/54473; H01L 2223/5448; H01L 2224/29083
See application file for complete search history.

(56) References Cited

U.S. PATENT DOCUMENTS 5,138,439 A * 8/1992 Kobiki .................... H01L 23/36
257/704
6,177,352 B1 * 1/2001 Schonfeld ......... H01L 21/30621
257/E21.222
(Continued)

FOREIGN PATENT DOCUMENTS

| JP | 2003-158097 A | 5/2003 |
| JP | 2004-158739 A | 6/2004 |
| JP | 2006-344816 A | 12/2006 |

*Primary Examiner* — Galina G Yushina
(74) *Attorney, Agent, or Firm* — White & Case LLP (57) ABSTRACT

According to an embodiment, a semiconductor device includes a silicon substrate, a device layer, and a lower layer. The device layer is formed on an upper surface of the silicon substrate. The lower layer is formed on a lower surface of the silicon substrate and has a side surface connecting to a side surface of the silicon substrate. At least a pair of side surfaces of the semiconductor device has a curved shape widening from an upper side toward a lower side.

7 Claims, 5 Drawing Sheets

(51) Int. Cl.
*H01L 23/00* (2006.01)
*H01L 21/304* (2006.01)

(52) U.S. Cl.
CPC .............. *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/29166* (2013.01); *H01L 2224/29186* (2013.01); *H01L 2224/3303* (2013.01); *H01L 2224/33183* (2013.01); *H01L 2224/33505* (2013.01); *H01L 2924/01015* (2013.01); *H01L 2924/35121* (2013.01)

(56) References Cited

U.S. PATENT DOCUMENTS

| | | | |
|---|---|---|---|
| 6,294,439 B1* | 9/2001 | Sasaki | H01L 21/3043 |
| | | | 438/464 |
| 2006/0030127 A1* | 2/2006 | Fukasawa | H01L 21/56 |
| | | | 438/460 |
| 2009/0014736 A1* | 1/2009 | Ibbetson | H01L 33/44 |
| | | | 257/98 |
| 2011/0284822 A1* | 11/2011 | Jung | H01L 33/505 |
| | | | 257/13 |
| 2014/0087499 A1* | 3/2014 | Doan | H01L 33/0095 |
| | | | 438/28 |
| 2016/0133784 A1* | 5/2016 | Minamiru | H01L 21/78 |
| | | | 438/33 |
| 2017/0069535 A1* | 3/2017 | Masuko | H01L 21/78 |

* cited by examiner

SEMICONDUCTOR DEVICE AND DICING METHOD

CROSS REFERENCE TO RELATED APPLICATIONS

This application is based upon and claims the benefit of priority from the prior Japanese Patent Application No. 2018-033567, filed on Feb. 27, 2018, the entire contents of which are incorporated herein by reference.

FIELD

Embodiments described herein relate generally to a semiconductor device and dicing method.

BACKGROUND

Power devices formed on a silicon substrate undergo dicing after a pre-process, and the power device is packaged with its rear surface being connected using solder, eutectic metal or metal, or conductive resin or nonconductive resin. The metal or the like on the rear surface plays a role of electric connection, barrier metal for a connection material, a connection material, heat dissipation, or the like. Peeling of the metal or the like on the rear surface leads to an open failure to deteriorate electric properties. Further, a large crack in the metal or the like on the rear surface becomes a chip crack (fissure-shaped damage in a chip) when the metal or the like undergoes heat cycle, drop impact, mounting impact, or the like, and may lead to defective properties. In a case where a die attach film of nonconductive resin is used, the peeling of the rear surface or the presence of a large crack in the rear surface lowers the stability of die bonding. Therefore, avoiding a defect of the metal or the like on the rear surface caused by the cutting is an important thing leading to an improvement in reliability.

DETAILED DESCRIPTION

According to an embodiment, a semiconductor device includes a silicon substrate, device layer, and a lower layer. The device layer is formed on an upper surface of the silicon substrate. The lower layer is formed on a lower surface of the silicon substrate and has a side surface connecting to a side surface of the silicon substrate. At least a pair of side surfaces of the semiconductor device has a curved shape widening from an upper side toward a lower side.

An embodiment of the present invention will be hereinafter described with reference to the drawings. This embodiment does not limit the present invention. Note that, though the description in this embodiment uses up and down relations such as an upper side, a lower side, an upper surface, and a lower surface, these up and down relations are determined for convenience' sake and do not necessarily indicate up and down relations in terms of the gravitational direction during the manufacture, during the use, and so on. Further, the expression "having a curvature" does not necessarily mean that a portion in question constitutes part of the circumference, but is used to mean that a portion in question has a curved shape.

Figure 4:
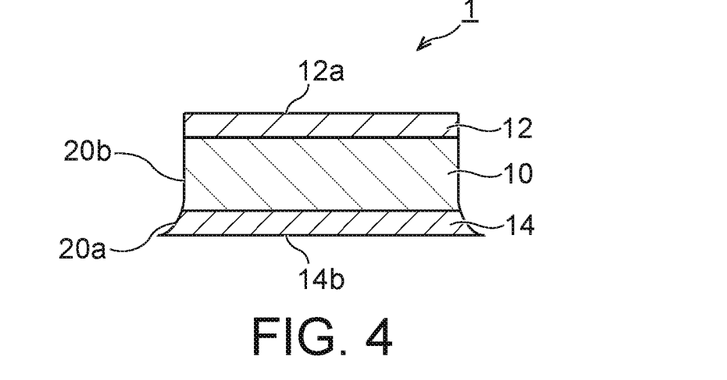
FIG. 4 is a sectional view of the semiconductor device 1 according to the embodiment.

Further, "vertical" does not necessarily mean strictly vertical, and for example, may include "substantially vertical" like the side surface of the semiconductor device 1 illustrated in FIG. 4.

The semiconductor device according to this embodiment has a device layer, a metal layer, and so on formed in its front surface by a semiconductor pre-process. After the completion of the pre-process, a rear surface of a silicon substrate is thinned using a back grinder, and by subsequent chemical polishing of the rear surface, fractured surfaces and/or adherent matter caused by the back grinding are removed, and thereafter rear metal is formed using a sputtering device, and the resultant is blade-diced into chips. Thereafter, the chip is encapsulated in a package using a die bonder.

FIG. 1A to FIG. 1E are views illustrating the states of the semiconductor device according to this embodiment up to the dicing. The semiconductor device uses a semiconductor substrate 10 illustrated in FIG. 1A, and the semiconductor device is formed on the silicon substrate 10.

Figure 1A:
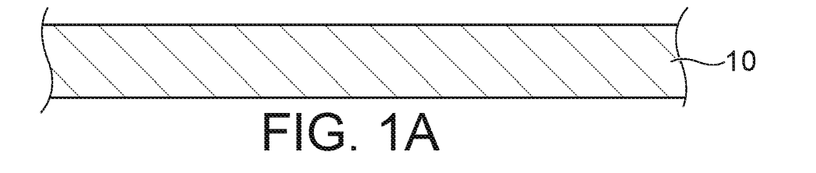
FIG. 1A to FIG. 1E are views illustrating manufacturing steps of a semiconductor device 1 according to one embodiment.
Figure 1B:
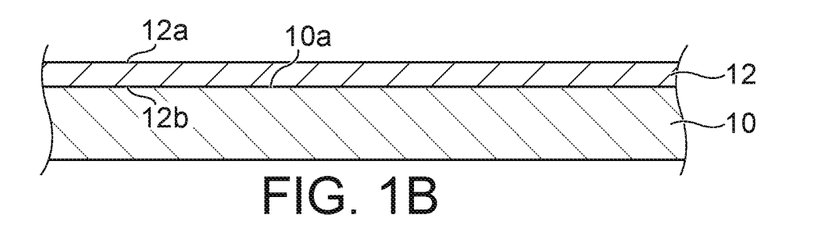

First, as illustrated in FIG. 1B, by the pre-process, the device layer 12 including various semiconductor films, insulating films, metal interconnecting wires, and so on is formed on an upper surface 10a of the silicon substrate 10. In forming the device layer 12, processing steps of the pre-process, such as, for example, cleaning, deposition, semiconductor film formation, insulating film formation, photolithography, etching, impurity doping, and activation are performed in a predetermined order. In the formed device layer 12, its upper surface 12a serves as a front surface and its lower surface 12b faces the upper surface 10a of the silicon substrate 10.

Figure 1C:
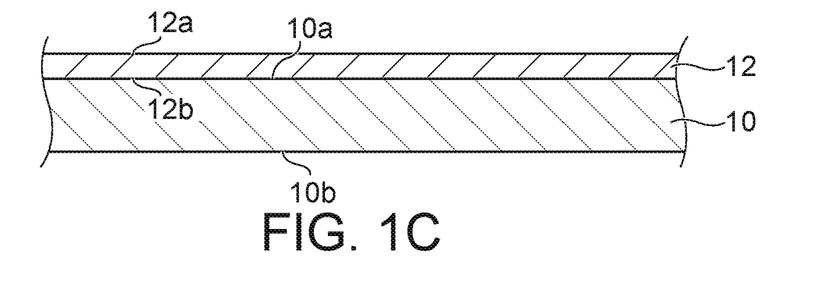

Next, as illustrated in FIG. 1C, the back grinding is applied to a surface of the silicon substrate 10 opposite to the upper surface 10a, that is, a surface opposite to the surface on which the device layer 12 is formed, to adjust the thickness of the silicon substrate 10. This process is not limited to the back grinding, but may be other physical thinning such as grinding, polishing, CMP (Chemical Mechanical Polishing), chemical etching, or sand blasting.

Thereafter, the lower surface 10b of the silicon substrate 10 is further lightly etched using a HF (hydrogen fluoride)-based chemical. The etching used is not limited to the etching using a chemical solution, but may be dry etching using gas. Alternatively, the light etching may be replaced by a step of removing only a necessary amount of a fractured surface of the rear surface by grinding or polishing.

Figure 1D:
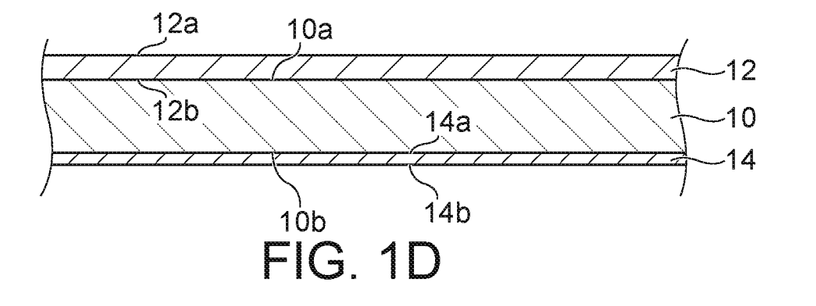

Next, as illustrated in FIG. 1D, a metal layer 14 is formed as a lower layer on the lower surface 10b of the silicon substrate 10 by sputtering. In the formed metal layer 14, its upper surface 14a faces the lower surface 10b of the silicon substrate 10. A method for forming the metal layer 14 is not limited to the sputtering, but may be vapor deposition, plating, or chemical or physical formation processing.

The metal may be formed by, for example, depositing Ti (titanium) and thereafter forming a Ni (nickel) film and an Au (gold) film so as to cover Ti. The metal of the metal layer 14 is not limited to Ti, but may be any metal as long as it can be the rear metal, and another example of the metal layer 14 is a metal film containing at least one of Ti, Cu (copper), Zn (zinc), Pd (palladium), Ni, Ag (silver), and Au.

Figure 1E:
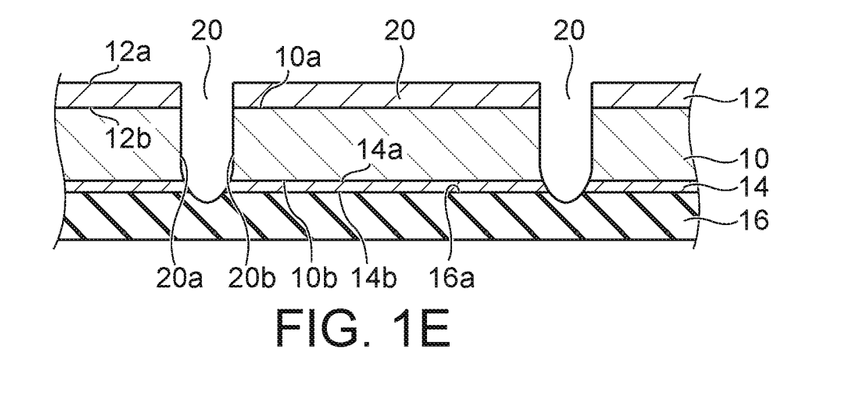

Next, as illustrated in FIG. 1E, the resultant is transferred onto a dicing tape 16 and is cut into chips using a blade dicer. The dicing tape 16 is set with its upper surface 16a facing a lower surface 14b of the metal layer 14, and cut regions 20 are formed using a dicing blade. The cut regions 20 are formed from the upper surface 12a of the device layer 12 so as to reach at least the dicing tape 16.

Figure 2:
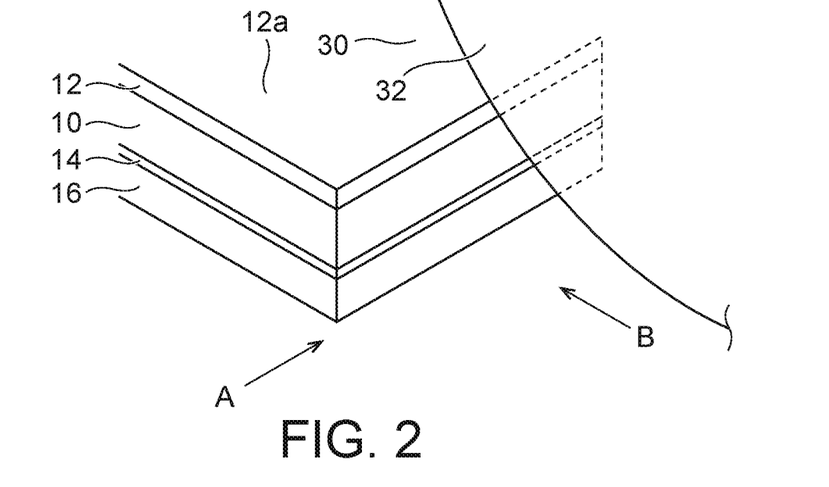
FIG. 2 is a view illustrating a dicing step of the semiconductor device 1 according to the embodiment.

FIG. 2 is a view illustrating a relation between the dicing blade 30 and the board to be cut. As illustrated in FIG. 2 and FIG. 3B (to be described later), the dicing blade 30 is set so as to dice the device layer 12, the silicon substrate 10, and the metal layer 14, for example, with part of the dicing tape 16 being cut to such a degree that an upper surface of the dicing tape 16 is superficially cut, and the dicing blade 30 dices the whole board.

As the dicing blade 30, one having a blade portion 32 suitable both for cutting metal and for cutting silicon is used. In the dicing, the blade portion 32 cuts the metal layer 14 and the silicon. As described above, in this cutting, the upper surface 16a of the dicing tape 16 is also superficially cut.

Figure 3A:
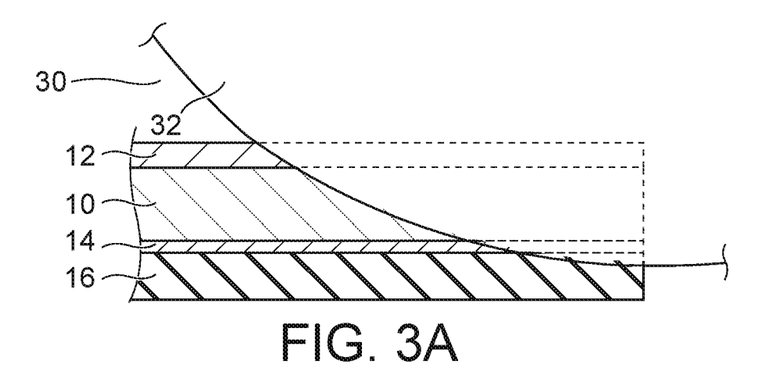
FIG. 3A and FIG. 3B are sectional views seen in the respective directions indicated in FIG. 2.
Figure 3B:
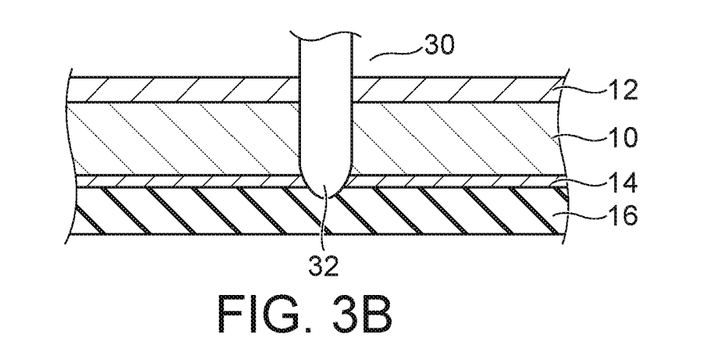

FIG. 3A and FIG. 3B are views illustrating the states of the board and the dicing blade 30 at a dicing instant. FIG. 3A and FIG. 3B are views seen in the direction A and the direction B indicated in FIG. 2 respectively, that is, views illustrating the states seen in a direction perpendicular to the dicing blade 30 and in a direction parallel to the dicing blade 30 respectively.

As illustrated in FIG. 3A, the blade portion 32 of the dicing blade 30 has a length large enough to cut at least the metal layer 14, the device layer 12, and the silicon substrate 10, and superficially cut the upper surface 16a of the dicing tape 16. The blade portion 32 cuts the device layer 12, the silicon substrate 10, the metal layer 14, and the upper surface 16a of the dicing tape 16 together. The width of the dicing blade 30 in this embodiment is 15 to 50 µm at its thick portion, but at least its portion cutting the metal layer 14 has a curvature at its edge and thus this portion is thinner than the thick root portion of the dicing blade 30. Further, the width of a dicing curve in the metal layer 14 differs depending on the depth of cut.

FIG. 3B is a view illustrating a cross section of the dicing blade 30 seen in the direction B. Incidentally, the dicing blade 30 is not hatched in FIG. 3B because a material of the dicing blade 30 is not limited.

A side surface of the blade portion 32 of the dicing blade 30 has such a curvature as to depict a curve from the middle of the height of the silicon substrate 10. This curvature is smooth as illustrated in FIG. 3B.

In the dicing blade 30, the blade portion 32 has diamond particles selected so as to be suitable both for cutting the metal and for cutting the silicon substrate 10, for instance.

As another example, instead of the dicing blade 30 being used so as to reach the middle of the dicing tape 16 as in the typical method, by adjusting the height of the dicing blade 30 so that up to the lower surface 14b of the metal layer 14 is cut and the vicinity of the upper surface of the dicing tape 16 is cut by the edge of the blade portion 32, it is possible for the lower portion of the semiconductor device 1 to have a curvature as illustrated in FIG. 1E as a result of the cutting. That is, the blade portion 32 of the dicing blade 30 may be controlled to be located at a position that is higher and further shallower than the position illustrated in FIG. 3A so that the metal layer 14 is cut.

As described above, in this embodiment, the dicing may be single-cut dicing that achieves the cutting up to the metal layer 14 and the transfer of the curvature that the side surface of the blade portion 32 has to the curvature of the side surface of the semiconductor device 1.

FIG. 4 is a view illustrating a cross section of the semiconductor device 1 according to this embodiment. In the semiconductor device 1, the metal layer 14, the silicon substrate 10, and the device layer 12 are formed in stack. In a side surface of the semiconductor device 1, a side surface 20b in the silicon substrate 10 has a curvature from the middle and connects to a side surface 20a of the metal layer 14 while maintaining the curvature. In other words, the side surface of the semiconductor device 1 has a curvature in such a manner that the area of the semiconductor device 1 in a plane view increases from an upper side toward a lower side of the side surface of the silicon substrate 10 and the side surface further widens toward a lower side of the metal layer 14 in contact with the lower surface 10b of the silicon substrate 10. Because of an individual difference, the side surface of the blade portion 32 of the dicing blade 30 is not exactly a flat surface, and accordingly, the whole side surface 20b may have a gentle curvature in conformity with the shape of the blade portion 32, instead of being strictly separated into a flat portion and a portion having the curvature.

The semiconductor device 1 in FIG. 4 is one chip taken out from the board illustrated in FIG. 1E, with the dicing tape 16 being removed from the lower surface 14b of the metal layer 14. In this state, the chip is die-bonding and thereafter goes through steps of wire bonding, molding, and so on, to be formed into a semiconductor package.

In the formed semiconductor device 1, the length of the lower surface 14b of the metal layer 14 is longer than the length of the upper surface 12a of the device layer 12 in the sectional view. Three-dimensionally speaking, for example, the chip is rectangular and is formed so as to have a larger area in the lower surface 14b of the metal layer 14 than in the upper surface 12a of the device layer 12. Further, in the formed semiconductor device 1, the length of each side of the lower surface 14b of the metal layer 14 is longer than the length of a corresponding side of the upper surface 12a of the device layer 12.

Thus making the lower surface larger in area than the upper surface makes it possible to keep a sufficient distance between chip front surfaces (that is, the upper surfaces 12a) in such a case where they are transported in a side-by-side arrangement after the dicing, to thereby reduce a possibility of the mutual contact of the front surfaces of the chips. Accordingly, the chips are unlikely to get chipped or surface chipping is unlikely to occur, due to the collision of the chips, leading to a quality improvement of the chips. As a result, it is possible to reduce a bonding failure or to prevent a decrease in flexural strength.

What chipping means here is that a surface is superficially cracked, has a fissure, or gets chipped. The chipping deteriorates the performance of the semiconductor device 1 when it is transported, processed, or used.

Figure 5:
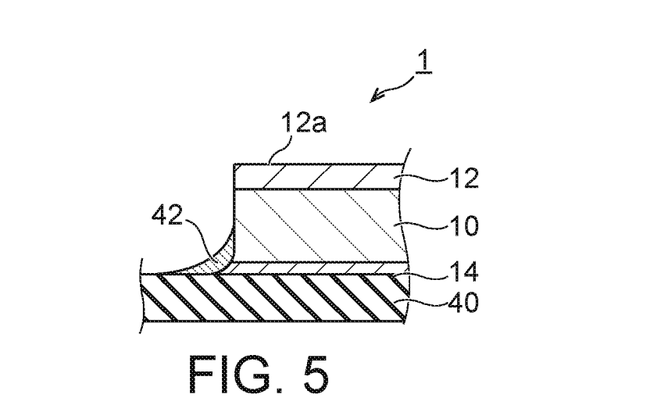
FIG. 5 is a view illustrating an example of the state where the semiconductor device 1 according to the embodiment is mounted.

FIG. 5 illustrates a state where the semiconductor device 1 is die-bonding on a support substrate 40. For example, the metal layer 14 is bonded on the support substrate 40 using solder 42. Owing to the curvature that the side surface of the semiconductor device 1 has, a contact surface between the solder 42 and the metal layer 14 is larger than in a case where the side surface is vertical. This as a result can improve die shear strength, that is, can improve die bondability. This is true not only in the bonding by the solder 42 but also in the bonding by die bonding resin.

Further, owing to the presence of the curvature as illustrated in FIG. 5, the connection area between the solder 42 and the metal layer 14 at the time of the bonding by the solder 42 is larger than in the case where the side surface of the metal layer 14 is vertical. This increases the distance of the side surface up to the front surface of the semiconductor device 1, making it possible to prevent the metal layer 14 and the device layer 12 from being short-circuited on the side surface, prevent the metal layer 14 and the front surface of the device layer 12 from being short-circuited, and prevent the interconnecting wires in the device layer 12 in the front surface and the solder used for the bonding from being short-circuited. For the same reason, it is possible to reduce a leakage current from the side surface of the semiconductor device 1 through the solder 42.

However, if a length by which the lower surface 14b of the metal layer 14 is longer than the upper surface 12a of the device layer 12 is over about 25% of the thickness of the semiconductor device 1, the area necessary as the chip becomes large and the curvature of the side surface becomes gentle, and moreover, the dicing blade 30 comes to have an unusual shape, which is not preferable. More preferably, the length by which the lower surface 14b of the metal layer 14 protrudes from the upper surface 12a of the device layer 12 is desirably about 5% to about 25% of the thickness of the semiconductor device 1.

As described above, according to this embodiment, the semiconductor device 1 has a shape whose side surface has the curvature from the upper surface toward the lower surface and which has a larger area in the lower surface than in the upper surface, making it possible to improve the die-bonding strength while reducing the leakage current. Further, since the distance to the front surface is long, a short circuit on the side surface is unlikely to occur. Preventing the short circuit between the metal layer 14 and the side surface also makes it possible to prevent the short circuit between the metal layer 14 and the front surface such as a wiring layer of the semiconductor device 1 and the short circuit between the side surface and the front surface of the semiconductor device 1. In addition, since it is possible to keep the distance between the chip front surfaces long, the collision of the chips is unlikely to occur during the transport after the dicing, making it possible to improve the qualities of the chips.

In many cases, typically, silicon and metal are separately cut, but in this embodiment, one dicing blade is used for the cutting. This as a result can increase the throughput in the dicing step. Dual cutting enables a further increase in this throughput.

Incidentally, in the above, the lower layer of the semiconductor device 1 is the metal layer 14, but may be a die attach film. The die attach film may be a conductive die attach film, for instance. Forming the semiconductor device 1 using the die attach film enables stacking without processing the semiconductor device 1 when the semiconductor package is manufactured by the stacking.

MODIFICATION EXAMPLES

In the above-described embodiment, the dicing is the single-cut dicing, but is not limited to this and may be step-cut dicing Specifically, in this modification example, a dicing blade for cutting the silicon substrate 10 and a dicing blade for cutting the metal layer 14 are separately prepared, and these layers are cut using the dicing blades more suitable for the respective layers. That is, the silicon substrate 10 may be cut by a blade portion 32 of a dicing blade 30 for cutting silicon, and the metal layer 14 may be cut by a blade portion 32 of a dicing blade 30 for cutting metal.

Figure 6:
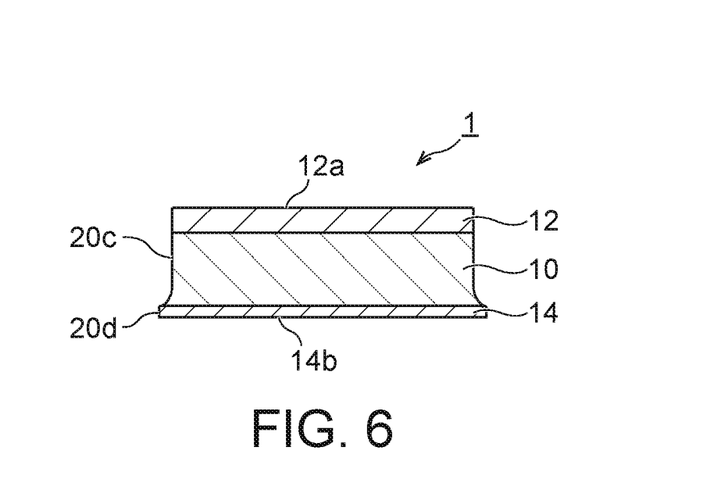
FIG. 6 is a sectional view of another example of the semiconductor device 1 according to the embodiment.

FIG. 6 is a view illustrating a semiconductor device 1 formed by the step cutting. To form the semiconductor device 1 according to this modification example, first cutting is first performed to the board having undergone the pre-process, up to such a depth as to penetrate through the lower surface 10b of the silicon substrate 10 using a first dicing blade for cutting silicon. The first cutting may reach the upper surface 14a of the metal layer 14, but does not completely cut the metal layer 14 because its purpose is not to cut the metal layer 14.

After the first cutting is finished, second cutting is performed to the metal layer 14 exposed to a first cut surface, using a second dicing blade narrower in blade width than the first dicing blade, so as to cut up to the lower surface 14b of the metal layer 14. The second cutting may superficially cut the upper surface 16a of the dicing tape 16 as in the above-described embodiment.

In the first cutting, the cutting is performed so as to cause a side surface 20c to have a curvature as in the semiconductor device 1 according to the above-described embodiment. This is because up to the silicon substrate 10 is cut into the same sectional shape as that of the dicing blade. In the subsequent second cutting, the metal layer 14 is cut vertically. Alternatively, in this modification example as well, the cutting is performed so as to cause an exposed side surface 20d to have a cross section having a curvature as in the above-described embodiment, as illustrated in FIG. 4 or FIG. 7.

Figure 7:
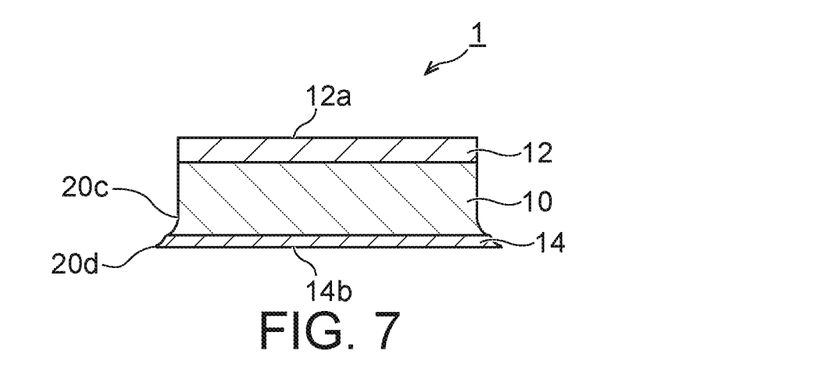
FIG. 7 is a sectional view of a semiconductor device 1 according to a modification example.

FIG. 7 is a view illustrating a semiconductor device 1 according to a modification example of FIG. 6. The cross section illustrated in FIG. 7 is formed by adjusting the height of the dicing blade so that the cutting is performed up to the lower surface 14b of the metal layer 14 as described in the above-described embodiment when the metal layer 14 is cut. As described above, the height may be adjusted so that the dicing tape 16 is cut up to its middle, that is, the upper surface 16a of the dicing tape 16 is superficially cut.

Figure 8:
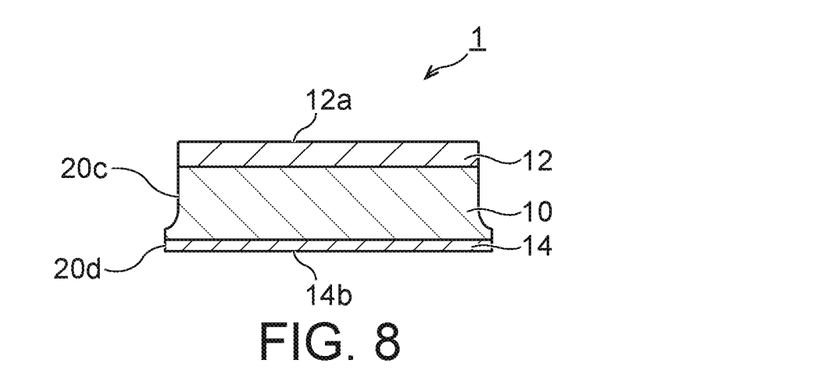
FIG. 8 is a sectional view of a semiconductor device 1 according to a modification example.

FIG. 8 is a view illustrating a semiconductor device 1 according to another example of this embodiment. As illustrated in FIG. 8, the substantially vertical portion may extend to a lower side of the silicon substrate 10. In such a case as well, the same effects as those in FIG. 6 and so on can be obtained.

Figure 9:
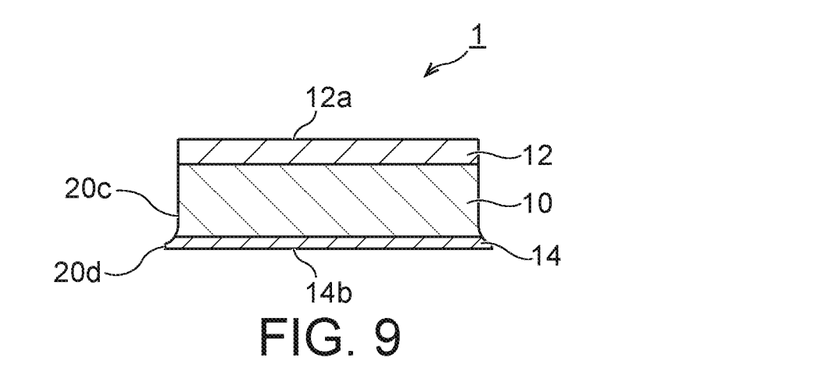
FIG. 9 is a sectional view of a semiconductor device 1 according to a modification example.

FIG. 9 is a view illustrating a semiconductor device 1 according to still another example of this embodiment. As illustrated in FIG. 9, when the silicon substrate 10 is cut, an upper layer portion of the metal layer 14 may also be cut.

As described above, according to these modification examples, owing to the curvature that the side surface 20c has, the lower surface 14b is larger in area than the upper surface 12a, and in a case where the chip shape, that is, the shape of the semiconductor device 1 is rectangular, the length of each side of the lower surface 14b is longer than the length of the corresponding side of the upper surface 12a, as in the semiconductor device 1 according to the above-described embodiment. This difference in length makes it possible to reduce the collision of the upper surfaces 12 of the semiconductor devices 1. The step cutting permits the selection of the blades for metal and for silicon, leading to a further quality improvement, compared with the aforesaid single cutting.

Specifically, since the blades for cutting the silicon substrate 10 and for cutting the metal layer 14 are different, the chipping of the front surface and the side surface of the silicon substrate 10 and the rear chipping in the lower surface 14b of the metal layer 14 are prevented in the dicing step, leading to an improvement in deflective strength and making it possible to improve a yield of the chips. Further, even if a crack such as a fissure occurs in the lower portion of the silicon substrate 10, since the lower surface 10b of the silicon substrate 10 suffering the chipping physically connects to the upper surface 14a of the metal layer 14 and the portion suffering the chipping is fixed to the metal layer 14 on at least its lower surface, the portion suffering the chipping does not easily peel off, making it possible to prevent the generation of dust in a post-process.

Further, in the case where the side surface 20d is vertical, in the side surface 20d, an effect on a bonding agent such as the solder or the die bonding resin is the same as the conventional effect, but owing to the curvature that the side surface 20c has, a force pressing a side of the side surface 20c from above is applied from the bonding agent as in the above-described embodiment, making it possible to obtain the same effects. In a case where the bonding agent is a conductive bonding agent such as solder, it is also possible to further reduce the leakage of a current in the side surface or the front surface as in the above-described embodiment While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in cutting out the semiconductor device 1 as a chip, the board is cut in directions intersecting with each other, and the cutting in one of the directions may be the single cutting, and the cutting in the other direction may be the step cutting. The cutting in the both directions may of course be the single cutting or the step cutting. Further, out of the two pairs of opposed side surfaces, only one pair of the side surfaces may have a curvature as described above.

Further, the silicon substrate 10 of the semiconductor device 1 may be replaced by a different substrate. For example, when the substrate is a substrate using gallium nitride (GaN), silicon carbide (SiC), or the like, the dicing method according to the above-described embodiment can also bring about the same effects as are obtained in the above-described semiconductor device 1.

Figure 10:
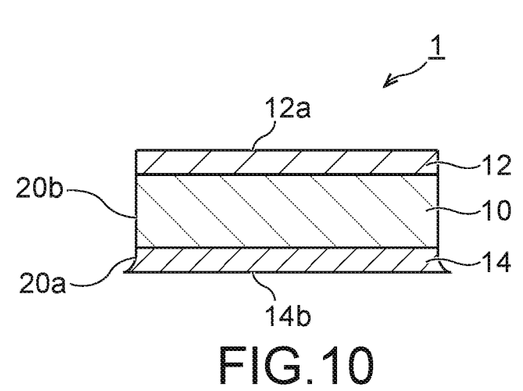
FIG. 10 is a sectional view of another example of the semiconductor device 1 according to the embodiment.

Further, the semiconductor device 1 may be formed such that its side surface has a curvature from the middle of the metal layer 14 as illustrated in FIG. 10. The position of the curve in the silicon substrate 10 and the metal layer 14 may be thus varied depending on the thickness of the metal layer 14.

The shape of the above-described semiconductor device 1 can be found through the observation of the cross section of the chip or the observation of its side surface using a microscope or the like, for instance.

The invention claimed is:
1. A semiconductor device comprising:
   a silicon substrate;
   a device layer formed on an upper surface of the silicon substrate;
   a lower layer formed on a lower surface of the silicon substrate and having a side surface connecting to a side surface of the silicon substrate; and
   wherein at least a pair of side surfaces of the semiconductor device has a curved shape widening from an upper side toward a lower side;
   wherein the lower layer has a side surface having a curved shape widening from an upper side toward a lower side of the lower layer.
2. The semiconductor device according to claim 1, wherein an upper surface of the device layer is smaller in area than a lower surface of the lower layer.
3. The semiconductor device according to claim 1, wherein the silicon substrate has a curved shape in a lower portion of the silicon substrate, and the lower surface of the silicon substrate is larger in area than the upper surface of the silicon substrate.
4. The semiconductor device according to claim 2, wherein the silicon substrate has a curved shape in a lower portion of the silicon substrate, and the lower surface of the silicon substrate is larger in area than the upper surface of the silicon substrate.
5. The semiconductor device according to claim 1, wherein the lower layer has a vertical side surface.
6. The semiconductor device according to claim 1, wherein the lower layer is a metal layer containing at least one metal selected from nickel, titanium, gold, silver, copper, zinc, and palladium.
7. The semiconductor device according to claim 1, wherein the lower layer is a die attach film.

* * * * *